(12) United States Patent
Khellah et al.

(10) Patent No.: US 7,558,097 B2
(45) Date of Patent: Jul. 7, 2009

(54) MEMORY HAVING BIT LINE WITH RESISTOR(S) BETWEEN MEMORY CELLS

(75) Inventors: Muhammad M. Khellah, Tigard, OR (US); Dinesh Somasekhar, Portland, OR (US); Yibin Ye, Portland, OR (US); Nam Sung Kim, Portland, OR (US); Vivek De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 150 days.

(21) Appl. No.: 11/648,399

(22) Filed: Dec. 28, 2006

(65) Prior Publication Data

US 2008/0158932 A1 Jul. 3, 2008

(51) Int. Cl.
*G11C 5/06* (2006.01)
(52) U.S. Cl. .................................. 365/63; 365/154
(58) Field of Classification Search ................. 365/154, 365/63
See application file for complete search history.

(56) References Cited

U.S. PATENT DOCUMENTS

| | | | |
|---|---|---|---|
| 5,487,044 A * | 1/1996 | Kawaguchi et al. | ............ 365/63 |
| 6,181,608 B1 | 1/2001 | Keshavarzi | |
| 6,445,216 B1 | 9/2002 | Bruneau | |
| 6,566,914 B2 | 5/2003 | Bruneau | |
| 6,608,786 B2 | 8/2003 | Somasekhar | |
| 6,724,648 B2 | 4/2004 | Khellah | |
| 6,876,571 B1 | 4/2005 | Khellah | |
| 6,906,973 B1 | 6/2005 | Somasekhar | |
| 6,909,652 B2 * | 6/2005 | Ye et al. | ............... 365/203 |
| 6,992,339 B2 | 1/2006 | Keshavarzi | |
| 7,020,041 B2 | 3/2006 | Somasekhar | |
| 7,236,410 B2 | 6/2007 | Schrom | |
| 7,295,474 B2 | 11/2007 | Ye | |
| 7,342,845 B2 | 3/2008 | Somasekhar | |
| 7,385,865 B2 | 6/2008 | Khellah | |
| 7,403,426 B2 | 7/2008 | Hamzaoglu | |
| 2004/0047187 A1 * | 3/2004 | Sakakibara | ............ 365/185.29 |
| 2006/0054933 A1 | 3/2006 | Keshavarzi | |
| 2007/0002607 A1 | 1/2007 | Khellah | |
| 2008/0162869 A1 | 7/2008 | Kim | |
| 2008/0237678 A1 | 10/2008 | Datta | |

OTHER PUBLICATIONS

K. Zhang et al., "A 3GHz 70Mb SRAM in 65nm CMOS Technology with Integrated Column-Based Dynamic Power Supply," ISSCC Dig. Tech. Papers, Feb. 2005; 3 pages.

* cited by examiner

*Primary Examiner*—Hoai V Ho
*Assistant Examiner*—Kretelia Graham
(74) *Attorney, Agent, or Firm*—Erik R. Nordstrom (57) ABSTRACT

For one disclosed embodiment, an integrated circuit may comprise a memory array on the integrated circuit and access control circuitry on the integrated circuit. The memory array may have a bit line with one or more resistors along the bit line and may have a plurality of memory cells coupled to the bit line at a plurality of locations along the bit line. At least one resistor along the bit line may be between two locations at which memory cells are coupled to the bit line. The access control circuitry may be to select a memory cell coupled to the bit line and to sense a signal on the bit line from the selected memory cell. Other embodiments are also disclosed.

17 Claims, 6 Drawing Sheets

MEMORY HAVING BIT LINE WITH RESISTOR(S) BETWEEN MEMORY CELLS

FIELD

Embodiments described herein generally relate to memory.

BACKGROUND

Figure 1:
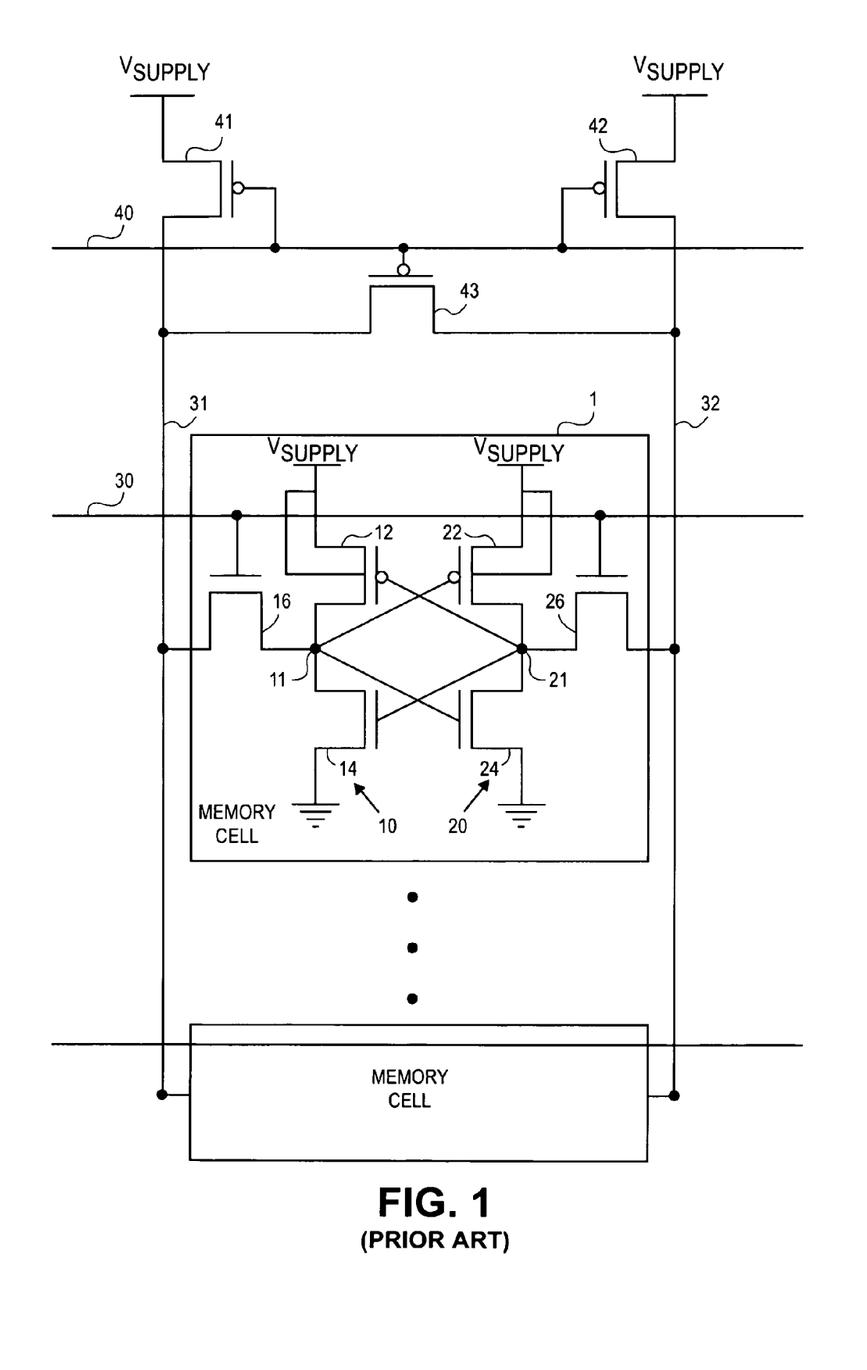
FIG. 1 illustrates circuitry for a prior art six transistor (6T) memory cell for a static random access memory (SRAM)

FIG. 1 illustrates circuitry for a prior art six transistor (6T) memory cell 1 for a static random access memory (SRAM). As illustrated in FIG. 1, memory cell 1 has two cross-coupled inverters 10 and 20 coupled between a supply voltage $V_{SUPPLY}$ node and a ground node to generate complementary signals at storage nodes 11 and 21. Inverter 10 has a pull-up p-channel field effect transistor (PFET) 12 and a pull-down n-channel FET (NFET) 14. The gates of PFET 12 and NFET 14 are both coupled to receive a signal at storage node 21 to generate an inverted signal at storage node 11. Similarly, inverter 20 has a pull-up PFET 22 and a pull-down NFET 24. The gates of PFET 22 and NFET 24 are both coupled to receive a signal at storage node 11 to generate an inverted signal at storage node 21. The complementary signals at storage nodes 11 and 21 represent a single bit value depending on which signal is at which storage node 11 or 21.

Memory cell 1 also has NFETs 16 and 26 to access memory cell 1 to read a bit value from and/or write a bit value to memory cell 1. The gate of NFET 16 is coupled to receive a signal on a word line 30 to couple storage node 11 to a bit line 31. The gate of NFET 26 is coupled to receive a signal on word line 30 to couple storage node 21 to a bit line 32. Memory cell 1 may then be accessed by sensing the complementary signals on bit lines 31 and 32 to read the bit value stored by memory cell 1 or by asserting complementary signals on bit lines 31 and 32 to write a bit value to memory cell 1. NFETs 16 and 26 are known as transfer, access, or pass transistors.

To speed reading the bit value, PFETs 41, 42, and 43 are activated in response to a signal on a precharge line 40 to precharge bit lines 31 and 32 by coupling them to a supply voltage $V_{SUPPLY}$ node. The bit value may then be read as soon as bit line 31 is pulled down by NFET pair 14 and 16 or bit line 32 is pulled down by NFET pair 24 and 26 without having to wait for the other bit line 32 or 31 to be pulled up.

Memory cell 1 may be designed to help meet a desired level of stability for a given memory size and process to help improve manufacturing yield. Memory cell 1 may be designed, for example, to account for mismatch in threshold voltage Vth of neighboring transistors as such mismatch reduces stability. As transistor dimensions are scaled, accounting for threshold voltage mismatch can prove challenging as the variability in the number and location of channel dopant atoms can result in restrictive electrical deviations in transistor threshold voltages Vth.

Read stability can be loosely defined as the probability that memory cell 1 will retain its stored bit value during a read operation. Memory cell 1 is susceptible to losing its stored bit value during a read operation due to a voltage bump resulting from charge sharing between a lightly loaded low storage node, such as storage node 21 for example, and a highly capacitive precharged bit line 32 when NFET 26 is activated. Memory cell 1 may lose its stored bit value if the magnitude of the voltage bump becomes larger than the trip point of inverter 10. Because such charge sharing results from the voltage division by neighboring NFETs 24 and 26 between precharged bit line 32 and ground, read stability is generally proportional to the ratio of the transconductance of NFET 24 relative to that of NFET 26.

Write stability can be loosely defined as the probability that memory cell 1 will be written with an intended bit value during a write operation. Because a write is performed by discharging the voltage at the high storage node, such as storage node 21 for example, through NFET 26, write stability is generally proportional to the ratio of the transconductance of NFET 26 relative to that of PFET 22.

Example ways to improve stability of memory cell 1 include (1) sizing pull-down NFET 14 and 24 to have an increased width at the expense of increased cell area and reduced write stability, (2) sizing access NFET 16 and 26 to have a larger channel length at the expense of reduced read current and therefore reduced read operation speed, (3) using a separate, increased supply voltage $V_{SUPPLY}$ at the expense of additional circuitry and increased power consumption and/or heat, and/or (4) adding a scalable negative supply voltage generator at the expense of additional circuitry to drive the source of pull-down NFET 14 and 24 to a negative voltage before word line 30 is activated to increase the strength of pull-down NFET 14 and 24.

BRIEF DESCRIPTION OF THE DRAWINGS

Embodiments are illustrated by way of example and not limitation in the figures of the accompanying drawings, in which like references indicate similar elements and in which.

The figures of the drawings are not necessarily drawn to scale.

DETAILED DESCRIPTION

The following detailed description sets forth example embodiments of apparatuses, methods, and systems relating to memory having a bit line with resistor(s) between memory cells. Features, such as structure(s), function(s), and/or characteristic(s) for example, are described with reference to one embodiment as a matter of convenience; various embodiments may be implemented with any suitable one or more described features.

Figure 2:
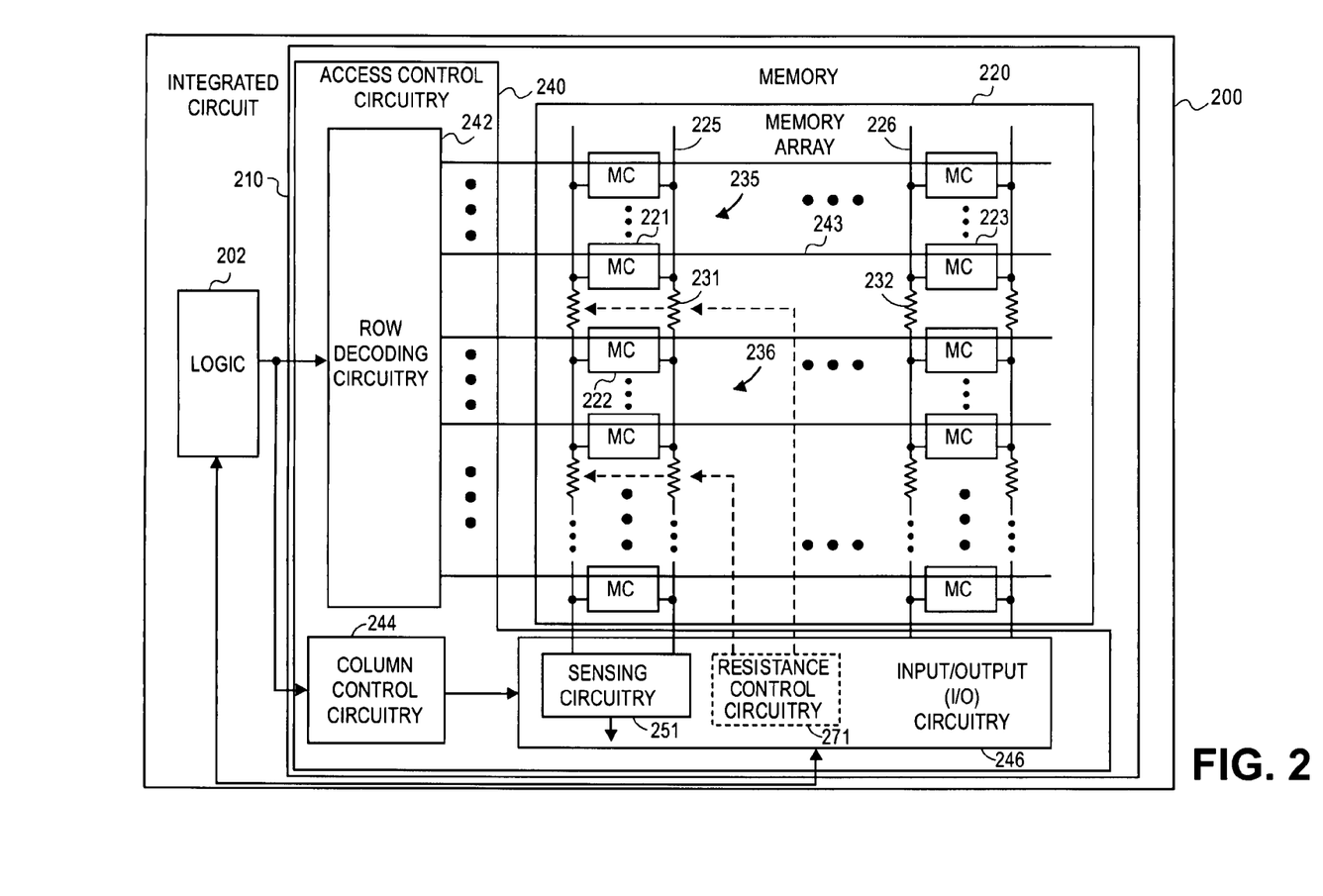
FIG. 2 illustrates, for one embodiment, a block diagram of an integrated circuit having memory having a bit line with one or more resistors between memory cells.

FIG. 2 illustrates, for one embodiment, an integrated circuit 200 having memory 210 having a bit line with one or more resistors between memory cells. Memory 210 may include a memory array 220 and access control circuitry 240.

Memory array 220 may have a plurality of memory cells, such as memory cells (MC) 221, 222, and 223 for example, and may have bit lines, such as bit lines 225 and 226 for example, with one or more resistors, such as resistors 231 and 232 for example, along such bit lines. For one embodiment with reference to bit line 225, for example, a plurality of memory cells, such as memory cells 221 and 222 for example, may be coupled to bit line 225 at a plurality of locations along bit line 225. At least one resistor along bit line 225, such as resistor 231 for example, may be between two locations at which memory cells are coupled to bit line 225. Access control circuitry 240 may select a memory cell coupled to bit line 225, such as memory cell 221 for example, and may sense a signal on bit line 225 from memory cell 221.

Having one or more resistors along a bit line for one embodiment helps provide a resistive shield to reduce bit line capacitance presented to one or more memory cells coupled to the bit line. A memory cell that may otherwise be susceptible to losing a bit value stored by that memory cell due to a relatively high bit line capacitance may therefore be used for one embodiment with relatively reduced concern for cell stability. Reducing bit line capacitance presented, for example, to memory cell 1 of FIG. 1 during a read operation may help result in a reduced voltage bump resulting from charge sharing between storage node 21, for example, and precharged bit line 32, helping memory cell 1 to retain its stored bit value. Memory array 220 for one embodiment may therefore be designed with relatively denser memory cells, with relatively less circuitry to control supply voltage, and/or with relatively less power consumption.

Memory Array

Memory array 220 may include any suitable circuitry to implement any suitable memory cells coupled to bit lines in any suitable manner. Memory array 220 for one embodiment may have a plurality of memory cells coupled to a given one of the plurality of bit lines. Memory array 220 for one embodiment may have memory cells that store complementary signals representative of a bit value and for one embodiment, as illustrated in FIG. 2 for example, may have pairs of complementary bit lines with a plurality of memory cells coupled to a given pair of complementary bit lines. Memory array 220 for one embodiment may have memory cells logically arranged in any suitable number of rows and any suitable number of columns. A column of memory cells for one embodiment may correspond to memory cells coupled to the same bit line.

Memory cells for memory array 220 may include any suitable circuitry to implement any suitable memory cells to store data in any suitable manner. One or more memory cells for memory array 220 for one embodiment may include any suitable circuitry to store one or more signals representative of one bit value. One or more memory cells for memory array 220 for one embodiment may include any suitable circuitry to implement any suitable static random access memory (SRAM) cell. One or more memory cells for memory array 220 for one embodiment may include any suitable circuitry to implement any suitable six transistor (6T) SRAM cell. One or more memory cells for memory array 220 for one embodiment may include circuitry for a 6T SRAM cell similar to that shown in FIG. 1.

Access Control Circuitry

Access control circuitry 240 may include any suitable circuitry coupled to access memory cells of memory array 220 in any suitable manner. Access control circuitry 240 for one embodiment may access memory cells of memory array 220 in response to requests from logic 202. Logic 202 for one embodiment, as illustrated in FIG. 2, may be part of integrated circuit 200. Logic 202 for another embodiment may be external to integrated circuit 200.

Access control circuitry 240 for one embodiment may be coupled to receive address signals and/or one or more control signals from logic 202, for example, and may be coupled to receive data signals from and/or transmit data signals to logic 202, for example. Access control circuitry 240 for one embodiment may receive address signals to identify one or more memory cells from which data is to be read and optionally returned or to which data is to be written. Access control circuitry 240 for one embodiment may receive one or more control signals to identify whether data is to be written to or read from memory cells.

Access control circuitry 240 for one embodiment, as illustrated in FIG. 2, may include row decoding circuitry 242, column control circuitry 244, and input/output (I/O) circuitry 246.

Row decoding circuitry 242 for one embodiment may be coupled to receive at least a portion of an address from logic 202, for example, and to assert a signal on a corresponding word line to select memory cells in a row of memory cells of memory array 220 in response to the received address or address portion. Column control circuitry 244 for one embodiment may be coupled to receive at least a portion of the address from logic 202 and to assert one or more signals on one or more column select lines to select memory cells in columns of memory cells of memory array 220 in response to the received address or address portion. Column control circuitry 244 for one embodiment may assert signal(s) on column select line(s) to control multiplexers of I/O circuitry 246 to select columns and output data stored by memory cells in both a row selected by row decoding circuitry 242 and selected columns.

I/O circuitry 246 for one embodiment may include precharge circuitry coupled to precharge bit lines coupled to memory cells in columns. I/O circuitry 246 for one embodiment may include sensing circuitry, including sensing circuitry 251 for example, coupled to sense on bit lines corresponding to selected columns of memory cells signals representative of bit values from memory cells in a selected row and to output signals corresponding to the sensed signals. I/O circuitry 246 for one embodiment may include write drivers coupled to receive from logic 202, for example, signals representative of bit values and to assert corresponding signals on bit lines corresponding to selected columns of memory cells to write to memory cells in a selected row.

For one embodiment with reference to bit line 225, for example, a memory cell coupled to bit line 225, such as memory cell 221 for example, may be selected in response to assertion by row decoding circuitry 242 of a signal on a word line 243 coupled to memory cell 221. Memory cell 221 for one embodiment may generate a signal representative of a bit value stored by memory cell 221 on bit line 225 in response to being selected. Because resistor 231 for one embodiment may help provide a resistive shield to reduce bit line capacitance presented to memory cell 221, memory cell 221 for one embodiment may be designed, for example, similarly as memory cell 1 of FIG. 1 with relatively reduced concern for cell stability. Sensing circuitry 251 may include any suitable circuitry, such as a suitable sense amplifier for example, coupled to sense a signal on bit line 225 from memory cell 221.

Bit Line Resistors

Any suitable number of one or more resistors may be positioned at any suitable location along any suitable bit line for memory array 220 to divide the bit line and help reduce bit line capacitance presented to memory cells coupled to the bit line in any suitable manner. A bit line for one embodiment may have any suitable number of sections of any suitable number of one or more memory cells coupled to the bit line, where the number of memory cell(s) for a section may or may not be the same as that for another section. Such a bit line for one embodiment may have at least one resistor along the bit line between adjacent sections of memory cells. For one embodiment, multiple bit lines for memory array 220 may or may not have the same number of sections and/or the same number of memory cells in a section.

For one embodiment with reference to bit line 225, for example, a plurality of sections, such as sections 235 and 236 for example, of any suitable number of one or more memory cells may be coupled along bit line 225, and at least one resistor, such as resistor 231 for example, may be positioned along bit line 225 between adjacent sections of memory cells.

A bit line for one embodiment may have a number N of sections of an equal number M of one or more memory cells coupled to the bit line for N×M=R total memory cells coupled to the bit line. As one example, a bit line may have N=4 sections of M=64 memory cells for a total of R=256 memory cells coupled to the bit line with at least one resistor along the bit line between the first and second sections, between the second and third sections, and between the third and fourth sections.

A resistor along a bit line between two locations at which memory cells are coupled to the bit line for memory array 220 may be implemented in any suitable manner to have any suitable resistance. A resistor along a bit line between two locations at which memory cells are coupled to the bit line for one embodiment may be implemented to have a resistance greater than the resistance the bit line would otherwise have between the two locations with just a bit line segment instead of the resistor. A resistor for one embodiment may be implemented in any suitable manner using any suitable one or more devices having any suitable resistance. For one embodiment having multiple resistors along the same bit line, such resistors may or may not be similarly implemented. For one embodiment having multiple resistors along different bit lines for memory array 220, such resistors may or may not be similarly implemented.

A resistor along a bit line between two locations at which memory cells are coupled to the bit line for one embodiment may include any suitable one or more transistors. Such transistor(s) may be coupled in any suitable manner to help provide any suitable amount of resistance. A resistor for one embodiment may include transistors coupled in parallel. A resistor for one embodiment may include a suitable p-channel field effect transistor (PFET) coupled in parallel with a suitable n-channel field effect transistor (NFET).

One or more resistors along one or more bit lines for memory array 220 may be implemented in any suitable manner to be activated and/or set in any suitable manner.

One or more resistors for one embodiment may be implemented in any suitable manner as a passive resistor generally activated when memory 210 is activated. A resistor for one embodiment may include one or more transistors having a gate fixedly coupled to a supply voltage node to activate such transistor(s).

Figure 3:
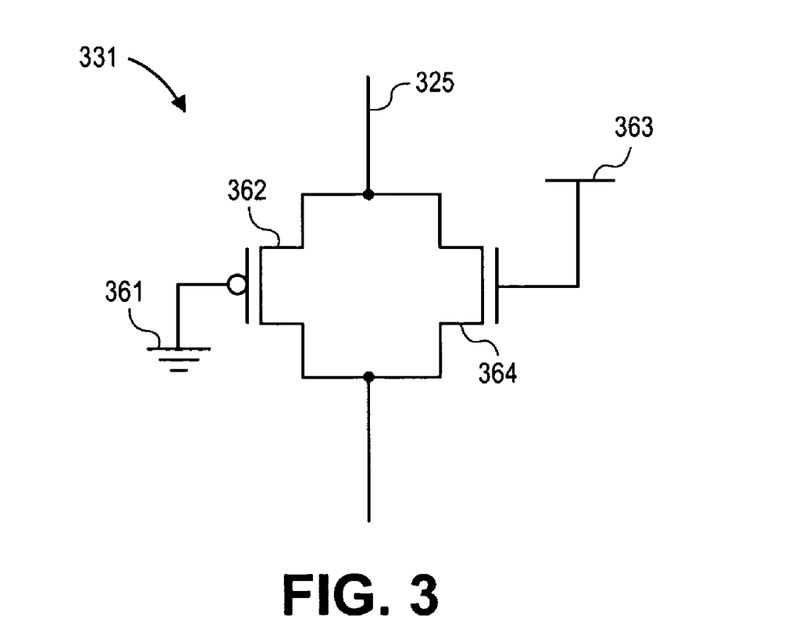
FIG. 3 illustrates, for one embodiment, example circuitry to implement a resistor on a bit line between memory cells.

FIG. 3 illustrates, for one embodiment, an example resistor 331 that includes a PFET 362 coupled in parallel with a NFET 364 along a bit line 325. A gate of PFET 362 may be coupled to a supply voltage node 361 to activate PFET 362. Supply voltage node 361 may be at any suitable voltage level, such as ground for example. A gate of NFET 364 may be coupled to a supply voltage node 363 to activate NFET 364. Supply voltage node 363 may be at any suitable voltage level.

One or more resistors for one embodiment may be implemented in any suitable manner as an active resistor that may be dynamically activated and/or set by any suitable resistance control circuitry. Such resistance control circuitry for one embodiment may be part of access control circuitry 240. Such resistance control circuitry for one embodiment, as illustrated in FIG. 2, may be part of I/O circuitry 246. For one embodiment with reference to bit line 225, for example, resistance control circuitry 271 may include any suitable circuitry coupled to activate and/or set one or more resistors, such as resistor 231 for example, along bit line 225.

One or more resistors for one embodiment may be implemented to be selectively activated by resistance control circuitry. A resistor for one embodiment may include one or more transistors that may be selectively activated by resistance control circuitry. A resistor for one embodiment may include one or more transistors having a gate coupled to receive a control signal asserted by resistance control circuitry, allowing resistance control circuitry to selectively activate one or more transistors by asserting one or more control signals and to selectively deactivate one or more transistors by deasserting one or more control signals.

Figure 4:
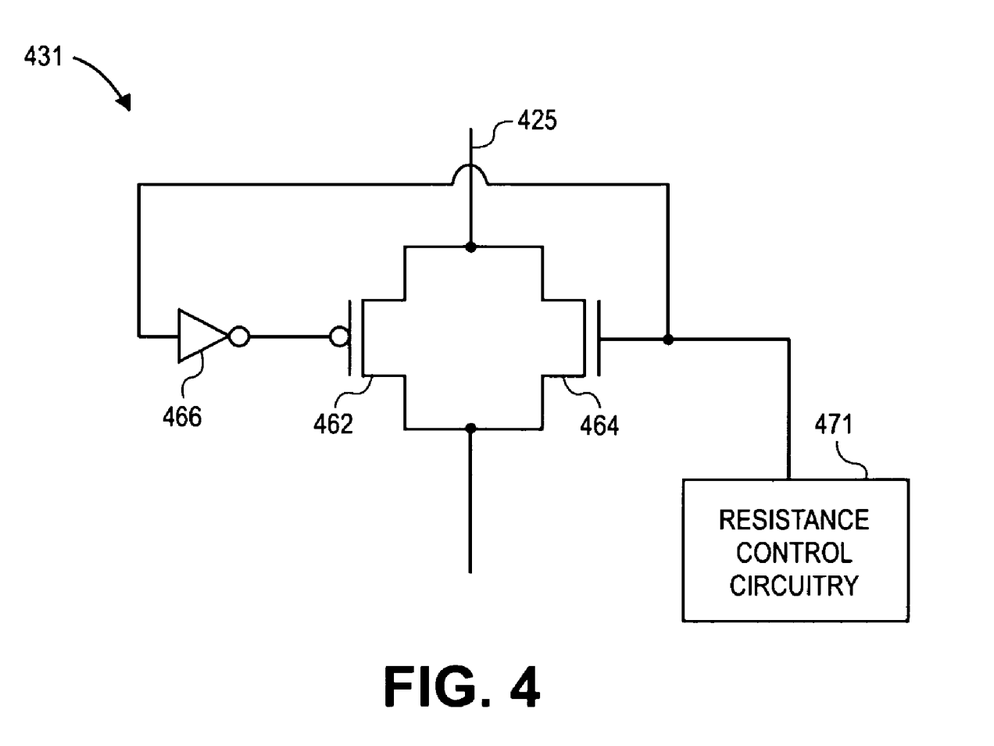
FIG. 4 illustrates, for one embodiment, example circuitry to implement a resistor on a bit line between memory cells.

FIG. 4 illustrates, for one embodiment, an example resistor 431 that includes a PFET 462 coupled in parallel with a NFET 464 along a bit line 425. A gate of NFET 464 may be coupled to receive an active high activate signal from resistance control circuitry 471 while a gate of PFET 462 may be coupled to receive the activate signal through an inverter 466 to activate both PFET 462 and PFET 464. For another embodiment where resistance control circuitry 471 may output an active low activate signal, inverter 466 may be coupled to invert the activate signal at the gate of NFET 464.

A resistor along a bit line for one embodiment may be implemented to decouple segments of the bit line when deactivated by resistance control circuitry, helping to further reduce bit line capacitance presented to a memory cell coupled to the bit line. Resistance control circuitry for one embodiment may activate one or more such resistors along the bit line following a delay after selection of a memory cell coupled to the bit line so the selected memory cell may be initially presented with such reduced bit line capacitance resulting from decoupling of segments of the bit line to help the selected memory cell retain its stored bit value. Resistance control circuitry for one embodiment may be programmable to set a desired delay to follow selection of a memory cell. For one embodiment, the delay may be programmed, for example, per memory array 220, per any suitable sub-array for memory array 220, or per process skew to track cell stability variations.

One or more resistors for one embodiment may be implemented to have a variable resistance that may be set by resistance control circuitry. A resistor for one embodiment may include one or more transistors, and resistance control circuitry for one embodiment may control a variable voltage applied to at least partially activate one or more transistors. A resistor for one embodiment may include one or more transistors having a gate coupled to receive a variable voltage signal asserted by resistance control circuitry, allowing resistance control circuitry to set the resistance of the resistor by controlling a voltage level of one or more signals.

Figure 5:
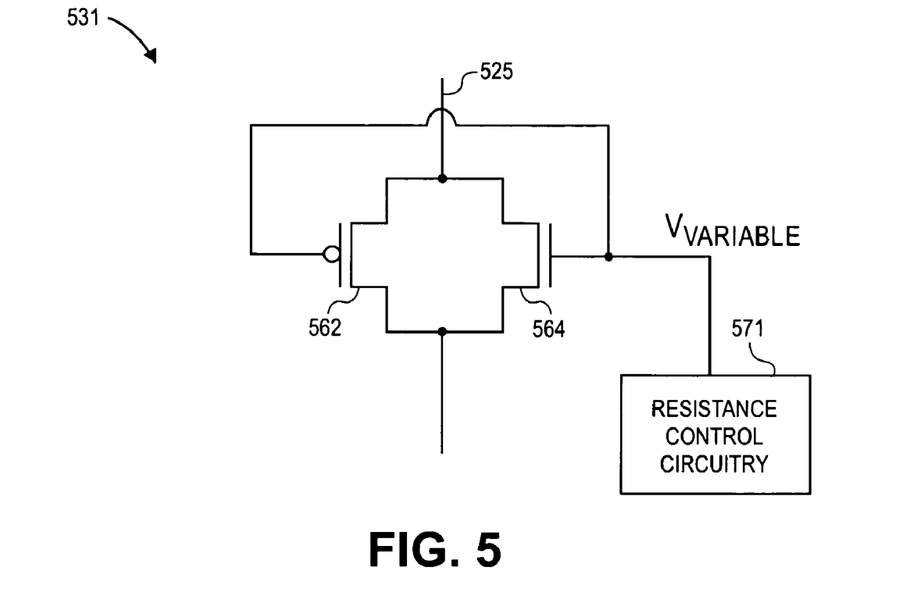
FIG. 5 illustrates, for one embodiment, example circuitry to implement a resistor on a bit line between memory cells.

FIG. 5 illustrates, for one embodiment, an example resistor 531 that includes a PFET 562 coupled in parallel with a NFET 564 along a bit line 525. The gates of PFET 562 and NFET 564 may both be coupled to receive a common variable voltage signal $V_{VARIABLE}$ applied by resistance control circuitry 571 to at least partially activate PFET 562 and/or NFET 564.

Resistance control circuitry for one embodiment may be programmable to set a desired resistance for one or more resistors.

One or more resistors for one embodiment may be implemented to be selectively activated by resistance control circuitry and to have a variable resistance that may be set by resistance control circuitry. Resistance control circuitry for one embodiment may be programmable to set a desired delay to follow selection of a memory cell and to set a desired resistance for one or more resistors. Resistance control circuitry for one embodiment may be programmed with a desired trade off between cell stability and read access time increased by the delay.

Resistance control circuitry for one embodiment may activate and/or set resistors along multiple bit lines for memory array 220.

Resistance control circuitry for one embodiment may include any suitable circuitry corresponding to one or more bit lines, such as resistance control circuitry 271 of FIG. 2 for example, to activate and/or set one or more resistors along one or more bit lines for memory array 220 separately from one or more resistors along one or more other bit lines for memory array 220. Resistance control circuitry for one embodiment may include any suitable circuitry corresponding to bit line pairs to activate and/or control one or more resistors along one or more pairs of complementary bit lines for memory array 220 separately from one or more resistors along one or more other pairs of complementary bit lines for memory array 220.

For a memory access, resistance control circuitry for one embodiment may activate all resistor(s) along one or more bit lines to allow such bit line(s) to be precharged and then continue to activate, or deactivate and then reactivate, any resistor(s) that are along a bit line for a selected column and between a selected row of memory cells and I/O circuitry 246 for read and/or write access by I/O circuitry 246 to one or more memory cells in a selected row and one or more selected columns. Resistance control circuitry for one embodiment may reactivate such resistor(s) following precharge with any suitable activation delay and/or may set such resistor(s) to have any suitable resistance. For write access, resistance control circuitry for one embodiment may allow such resistor(s) to remain activated following precharge or may reactivate such resistor(s) with reduced or no delay to help speed the write access. Resistance control circuitry for one embodiment may optionally deactivate any other resistor(s) following precharge such as, for example, any resistor(s) along a bit line for a non-selected column and/or any resistor(s) along a bit line for a selected column but not between a selected row and I/O circuitry 246.

Figure 6:
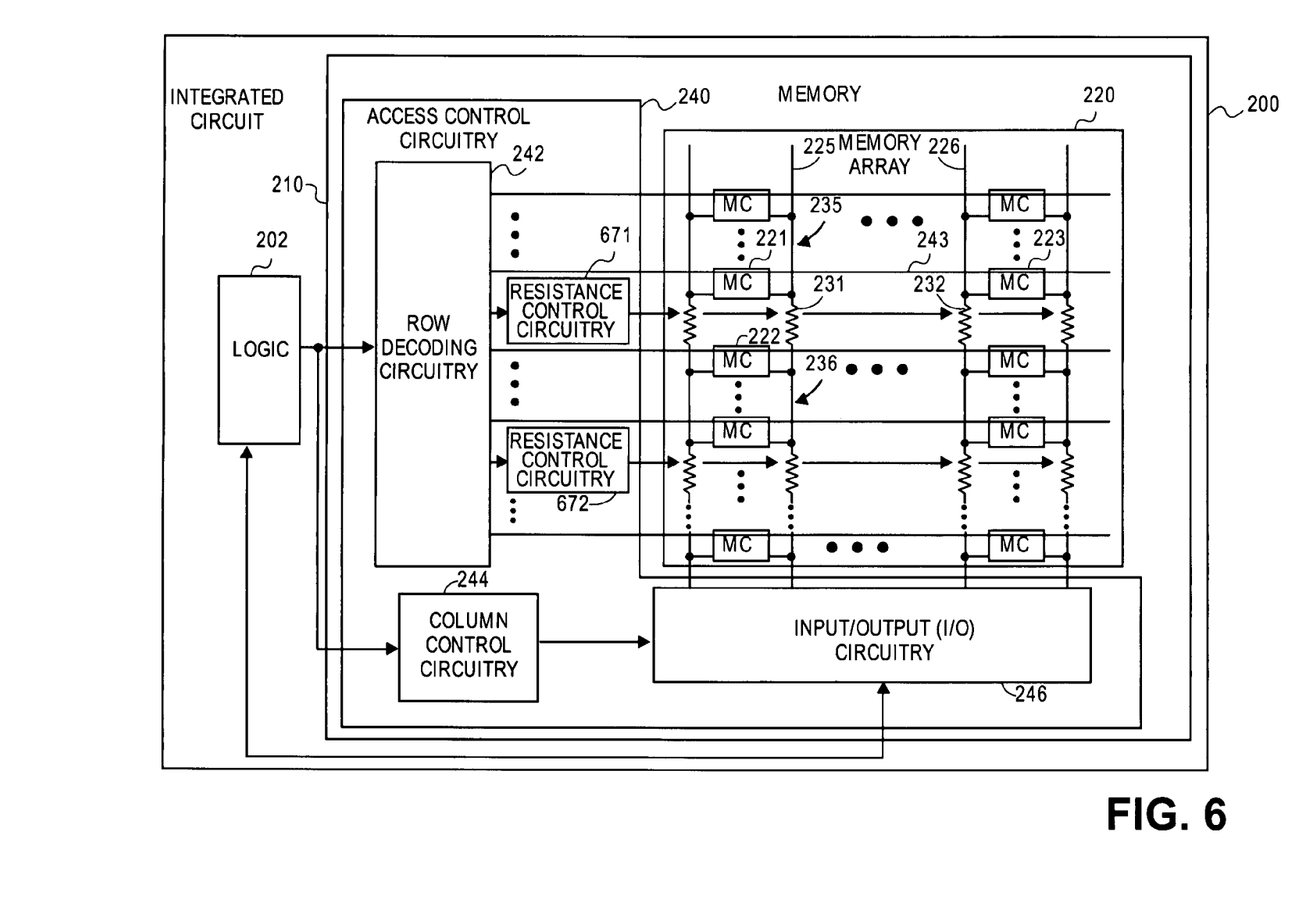
FIG. 6 illustrates, for one embodiment, a block diagram of an integrated circuit having memory having a bit line with one or more resistors between memory cells.

Resistance control circuitry for one embodiment may include any suitable circuitry corresponding to one or more rows of resistors across multiple bit lines, such as resistance control circuitry 671 and 672 of FIG. 6 for example, to activate and/or set resistors across multiple bit lines.

For a memory access, resistance control circuitry for one embodiment may activate all row(s) of resistors across multiple bit lines to allow such bit line(s) to be precharged and then continue to activate, or deactivate and then reactivate, any resistors that are along a bit line and between a selected row of memory cells and I/O circuitry 246 for read and/or write access by I/O circuitry 246 to one or more memory cells in a selected row. Resistance control circuitry for one embodiment may reactivate such resistors following precharge with any suitable activation delay and/or may set such resistors to have any suitable resistance. Resistance control circuitry for one embodiment may optionally deactivate any other resistors following precharge such as, for example, any resistors along a bit line and not between a selected row and I/O circuitry 246.

Example Operation

Figure 7:
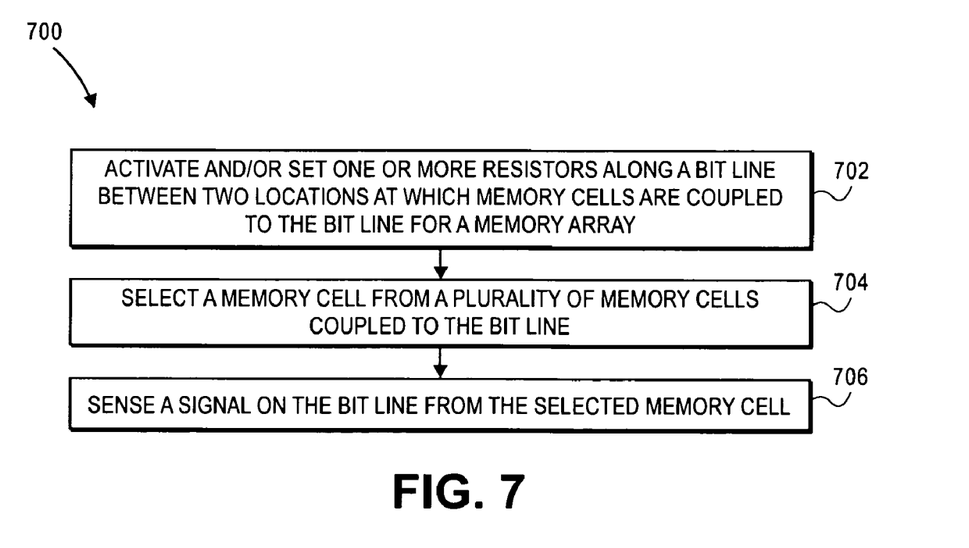
FIG. 7 illustrates, for one embodiment, a flow diagram to access a memory cell in memory having a bit line with one or more resistors between memory cells.

FIG. 7 illustrates, for one embodiment, a flow diagram 700 to access a memory cell in memory 210. For block 702 of FIG. 7, one or more resistors along a bit line between two locations at which memory cells are coupled to the bit line for memory array 220 may be activated and/or set. For block 704, a memory cell may be selected from a plurality of memory cells coupled to the bit line. For block 706, a signal on the bit line from the selected memory cell may be sensed.

Activating one or more resistors for one embodiment for block 702 may include using one or more supply voltage nodes fixedly coupled to a gate of one or more transistors of a resistor along the bit line between two locations at which memory cells are coupled to the bit line. Activating one or more resistors for one embodiment for block 702 may include selectively activating one or more resistors along the bit line between two locations at which memory cells are coupled to the bit line. Activating one or more resistors for one embodiment for block 702 may include selectively activating one or more transistors of a resistor along the bit line between two locations at which memory cells are coupled to the bit line.

Setting one or more resistors for one embodiment for block 702 may include setting a variable resistance of one or more resistors along the bit line between two locations at which memory cells are coupled to the bit line. Setting one or more resistors for one embodiment for block 702 may include controlling a variable voltage applied to at least partially activate one or more transistors of a resistor along the bit line between two locations at which memory cells are coupled to the bit line.

Example System

Figure 8:
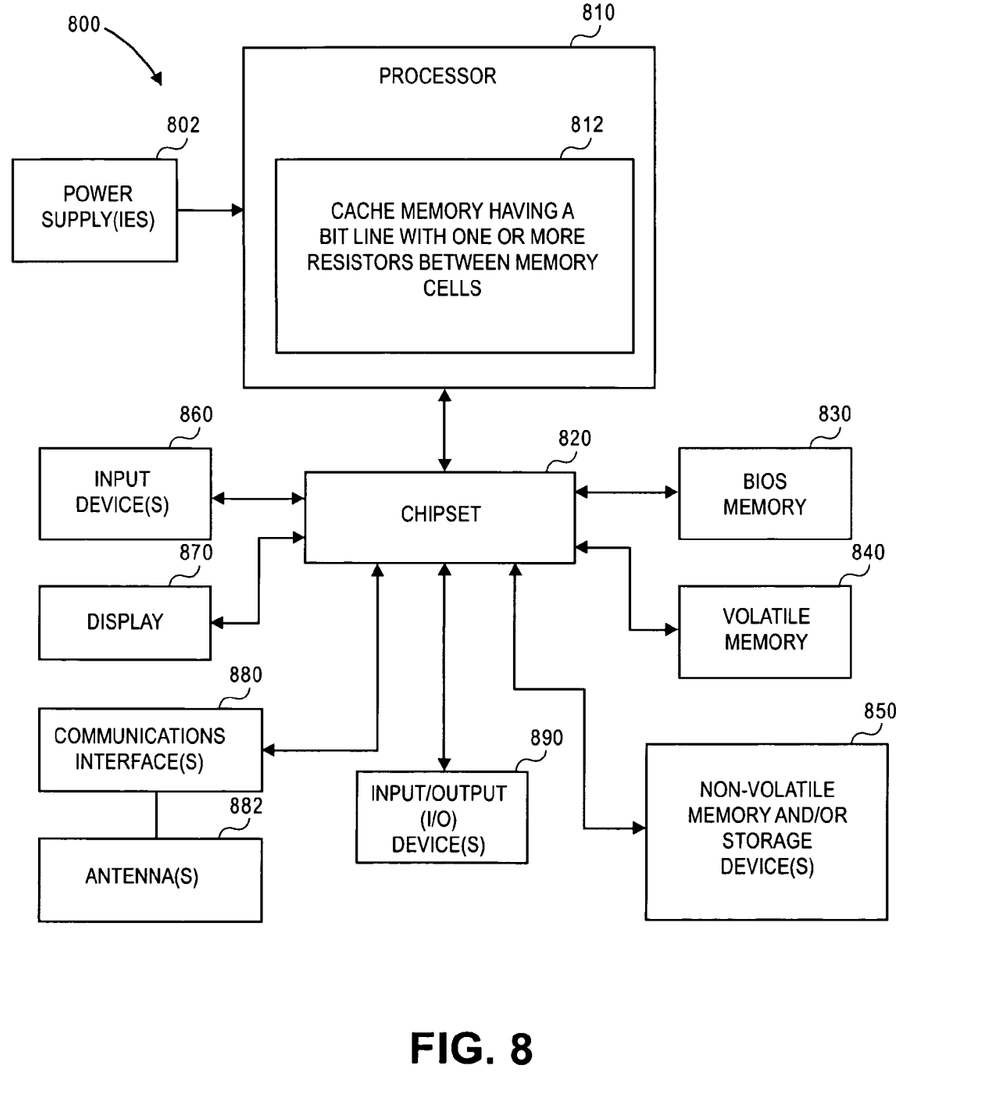
FIG. 8 illustrates, for one embodiment, a block diagram of an example system comprising a processor having cache memory having a bit line with one or more resistors between memory cells.

Integrated circuit 200 with memory 210 of FIGS. 2 and 6 may be used in any suitable system. Integrated circuit 200 with memory 210 for one embodiment may respectively correspond to an integrated circuit having cache memory 812 having a bit line with one or more resistors between memory cells for a processor 810 used in a system 800 as illustrated in FIG. 8. Integrated circuit 200 for one embodiment may also correspond to an integrated circuit with cache memory separate from processor 810. System 800 for another embodiment may include multiple processors one or more of which may have an integrated circuit having cache memory 812 having a bit line with one or more resistors between memory cells.

Processor 810 for one embodiment may be coupled to receive power from one or more power supplies 802. Power supply(ies) 802 for one embodiment may include one or more energy cells, such as a battery and/or a fuel cell for example. Power supply(ies) 802 for one embodiment may include an alternating current to direct current (AC-DC) converter. Power supply(ies) 802 for one embodiment may include a DC-DC converter. Power supply(ies) 802 for one embodiment may include one or more voltage regulators to help supply power to processor 810.

System 800 for one embodiment may also include a chipset 820 coupled to processor 810, a basic input/output system (BIOS) memory 830 coupled to chipset 820, volatile memory 840 coupled to chipset 820, non-volatile memory and/or storage device(s) 850 coupled to chipset 820, one or more input devices 860 coupled to chipset 820, a display 870 coupled to chipset 820, one or more communications interfaces 880 coupled to chipset 820, and/or one or more other input/output (I/O) devices 890 coupled to chipset 820.

Chipset 820 for one embodiment may include any suitable interface controllers to provide for any suitable communications link to processor 810 and/or to any suitable device or component in communication with chipset 820.

Chipset 820 for one embodiment may include a firmware controller to provide an interface to BIOS memory 830. BIOS memory 830 may be used to store any suitable system and/or video BIOS software for system 800. BIOS memory 830 may include any suitable non-volatile memory, such as a suitable flash memory for example. BIOS memory 830 for one embodiment may alternatively be included in chipset 820.

Chipset 820 for one embodiment may include one or more memory controllers to provide an interface to volatile memory 840. Volatile memory 840 may be used to load and store data and/or instructions, for example, for system 800. Volatile memory 840 may include any suitable volatile memory, such as suitable dynamic random access memory (DRAM) for example. Processor 810 for one embodiment may use cache memory 812 to store data and/or instructions stored or to be stored in volatile memory 840, for example, for faster access to such data and/or instructions.

Chipset 820 for one embodiment may include a graphics controller to provide an interface to display 870. Display 870 may include any suitable display, such as a cathode ray tube (CRT) or a liquid crystal display (LCD) for example. The graphics controller for one embodiment may alternatively be external to chipset 820.

Chipset 820 for one embodiment may include one or more input/output (I/O) controllers to provide an interface to non-volatile memory and/or storage device(s) 850, input device(s) 860, communications interface(s) 880, and/or I/O devices 890.

Non-volatile memory and/or storage device(s) 850 may be used to store data and/or instructions, for example. Non-volatile memory and/or storage device(s) 850 may include any suitable non-volatile memory, such as flash memory for example, and/or may include any suitable non-volatile storage device(s), such as one or more hard disk drives (HDDs), one or more compact disc (CD) drives, and/or one or more digital versatile disc (DVD) drives for example.

Input device(s) 860 may include any suitable input device(s), such as a keyboard, a mouse, and/or any other suitable cursor control device.

Communications interface(s) 880 may provide an interface for system 800 to communicate over one or more networks and/or with any other suitable device. Communications interface(s) 880 may include any suitable hardware and/or firmware. Communications interface(s) 880 for one embodiment may include, for example, a network adapter, a wireless network adapter, a telephone modem, and/or a wireless modem. For wireless communications, communications interface(s) 880 for one embodiment may use one or more antennas 882.

I/O device(s) 890 may include any suitable I/O device(s) such as, for example, an audio device to help convert sound into corresponding digital signals and/or to help convert digital signals into corresponding sound, a camera, a camcorder, a printer, and/or a scanner.

Although described as residing in chipset 820, one or more controllers of chipset 820 may be integrated with processor 810, allowing processor 810 to communicate with one or more devices or components directly. As one example, one or more memory controllers for one embodiment may be integrated with processor 810, allowing processor 810 to communicate with volatile memory 840 directly.

In the foregoing description, example embodiments have been described. Various modifications and changes may be made to such embodiments without departing from the scope of the appended claims. The description and drawings are, accordingly, to be regarded in an illustrative rather than a restrictive sense.

What is claimed is:

1. An integrated circuit comprising:
a memory array on the integrated circuit, the memory array having a bit line with one or more resistors along the bit line and having a plurality of memory cells coupled to the bit line at a plurality of locations along the bit line, wherein at least one resistor along the bit line is between two locations at which memory cells are coupled to the bit line; and
access control circuitry on the integrated circuit to select a memory cell coupled to the bit line and to sense a signal on the bit line from the selected memory cell, wherein the access control circuitry includes resistance control circuitry to set a variable resistance of one or more resistors along the bit line between two locations at which memory cells are coupled to the bit line.

2. The integrated circuit of claim 1, wherein a resistor along the bit line between two locations at which memory cells are coupled to the bit line includes one or more transistors.

3. The integrated circuit of claim 1, wherein a resistor along the bit line between two locations at which memory cells are coupled to the bit line includes transistors coupled in parallel.

4. The integrated circuit of claim 1, wherein a resistor along the bit line between two locations at which memory cells are coupled to the bit line includes one or more transistors having a gate fixedly coupled to a supply voltage node.

5. The integrated circuit of claim 1, wherein the access control circuitry includes resistance control circuitry to selectively activate one or more resistors along the bit line between two locations at which memory cells are coupled to the bit line.

6. The integrated circuit of claim 5, wherein the resistance control circuitry is to selectively activate one or more transistors of a resistor along the bit line between two locations at which memory cells are coupled to the bit line.

7. The integrated circuit of claim 1, wherein the resistance control circuitry is to control a variable voltage applied to at least partially activate one or more transistors of a resistor along the bit line between two locations at which memory cells are coupled to the bit line.

8. The integrated circuit of claim 1, wherein the plurality of memory cells include static random access memory cells.

9. The integrated circuit of claim 1, wherein the memory array has a plurality of sections of memory cells coupled along the bit line and at least one resistor along the bit line between adjacent sections of memory cells.

10. A method comprising:
selecting a memory cell from a plurality of memory cells of a memory array having a bit line with one or more resistors along the bit line, the plurality of memory cells coupled to the bit line at a plurality of locations along the bit line wherein at least one resistor along the bit line is between two locations at which memory cells are coupled to the bit line;
setting a variable resistance of one or more resistors along the bit line between two locations at which memory cells are coupled to the bit line; and
sensing a signal on the bit line from the selected memory cell.

11. The method of claim 10, comprising: activating one or more resistors along the bit line between two locations at which memory cells are coupled to the bit line.

12. The method of claim 11, wherein the activating includes using one or more supply voltage nodes fixedly coupled to a gate of one or more transistors of a resistor along the bit line between two locations at which memory cells are coupled to the bit line.

13. The method of claim 11, wherein the activating includes selectively activating one or more resistors along the bit line between two locations at which memory cells are coupled to the bit line.

14. The method of claim 11, wherein the activating includes selectively activating one or more transistors of a resistor along the bit line between two locations at which memory cells are coupled to the bit line.

15. The method of claim 10, comprising:
controlling a variable voltage applied to at least partially activate one or more transistors of a resistor along the bit line between two locations at which memory cells are coupled to the bit line.

16. A system comprising:
volatile memory; and
a processor having cache memory including a memory array and access control circuitry, the memory array having a bit line with one or more resistors along the bit line and having a plurality of memory cells coupled to the bit line at a plurality of locations along the bit line, wherein at least one resistor along the bit line is between two locations at which memory cells are coupled to the bit line, the access control circuitry to select a memory cell coupled to the bit line and to sense a signal on the bit line from the selected memory cell, wherein the access control circuitry includes resistance control circuitry to set a variable resistance of one or more resistors along the bit line between two locations at which memory cells are coupled to the bit line.

17. The system of claim 16, wherein the access control circuitry includes resistance control circuitry to selectively activate one or more resistors along the bit line between two locations at which memory cells are coupled to the bit line.

* * * * *